(12) United States Patent
Khlat

(10) Patent No.: US 12,627,269 B2
(45) Date of Patent: May 12, 2026

(54) ENVELOPE TRACKING INTEGRATED CIRCUIT OPERABLE ACROSS WIDE MODULATION BANDWIDTH

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 389 days.

(21) Appl. No.: 18/252,147

(22) PCT Filed: Sep. 17, 2021

(86) PCT No.: PCT/US2021/050892
§ 371 (c)(1),
(2) Date: May 8, 2023

(87) PCT Pub. No.: WO2022/103484
PCT Pub. Date: May 19, 2022

(65) Prior Publication Data
US 2024/0014787 A1     Jan. 11, 2024

Related U.S. Application Data

(60) Provisional application No. 63/114,185, filed on Nov. 16, 2020.

(51) Int. Cl.
*H03F 3/24*       (2006.01)
*H03F 3/393*      (2006.01)
*H03F 3/50*       (2006.01)

(52) U.S. Cl.
CPC ............. *H03F 3/245* (2013.01); *H03F 3/393* (2013.01); *H03F 3/505* (2013.01); *H03F 2200/102* (2013.01)

(58) Field of Classification Search
None
See application file for complete search history.

(56) References Cited

U.S. PATENT DOCUMENTS

| | | | |
|---|---|---|---|
| 4,646,035 A | 2/1987 | Chapelle | |
| 5,266,936 A | 11/1993 | Saitoh | |

(Continued)

FOREIGN PATENT DOCUMENTS

| | | | |
|---|---|---|---|
| CN | 103444076 A | 12/2013 | |
| CN | 103916093 A | 7/2014 | |

(Continued)

OTHER PUBLICATIONS

Intention to Grant for European Patent Application No. 21806074.7, mailed May 10, 2024, 27 pages.

(Continued)

*Primary Examiner* — Andrea Lindgren Baltzell
*Assistant Examiner* — Malane Lieng
(74) *Attorney, Agent, or Firm* — Withrow & Terranova, P.L.L.C.

(57)     ABSTRACT

An envelope tracking (ET) integrated circuit (ETIC) operable across wide modulation bandwidth is disclosed. The ETIC includes at least two auxiliary voltage outputs coupled to a high-bandwidth power amplifier circuit that has a lower equivalent capacitance, and thus a higher impedance resonance frequency. The ETIC also includes a pair of ET voltage circuits configured to generate a pair of ET voltages, respectively. To help mitigate potential distortion in the ET voltages, a control circuit is configured to couple the ET voltage circuits exclusively to the auxiliary voltage outputs when the ETIC needs to operate with a high modulation bandwidth (e.g., ≥200 MHz). Given the higher impedance resonance frequency of the high-bandwidth power amplifier circuit, it is possible to increase separation between an energy spectrum of a voltage disturbance and an energy spectrum of the high modulation bandwidth, thus helping to reduce the potential distortion in the ET voltages.

18 Claims, 6 Drawing Sheets

(56) References Cited

U.S. PATENT DOCUMENTS

| | | | |
|---|---|---|---|
| 5,510,753 | A | 4/1996 | French |
| 5,838,732 | A | 11/1998 | Carney |
| 6,107,862 | A | 8/2000 | Mukainakano et al. |
| 6,141,377 | A | 10/2000 | Sharper et al. |
| 6,141,541 | A | 10/2000 | Midya et al. |
| 6,411,531 | B1 | 6/2002 | Nork et al. |
| 6,985,033 | B1 | 1/2006 | Shirali et al. |
| 7,043,213 | B2 | 5/2006 | Robinson et al. |
| 7,193,467 | B2 | 3/2007 | Garlepp et al. |
| 7,471,155 | B1 | 12/2008 | Levesque |
| 7,570,931 | B2 | 8/2009 | McCallister et al. |
| 7,675,365 | B2 | 3/2010 | Lee et al. |
| 7,994,862 | B1 | 8/2011 | Pukhovski |
| 8,461,928 | B2 | 6/2013 | Yahav et al. |
| 8,493,141 | B2 | 7/2013 | Khlat et al. |
| 8,519,788 | B2 | 8/2013 | Khlat |
| 8,588,713 | B2 | 11/2013 | Khlat |
| 8,704,594 | B2 * | 4/2014 | Mulawski .................. H03F 3/19 |
| | | | 330/136 |
| 8,718,188 | B2 | 5/2014 | Balteanu et al. |
| 8,723,492 | B2 | 5/2014 | Korzeniowski |
| 8,725,218 | B2 | 5/2014 | Brown et al. |
| 8,774,065 | B2 | 7/2014 | Khlat et al. |
| 8,803,603 | B2 | 8/2014 | Wimpenny |
| 8,818,305 | B1 | 8/2014 | Schwent et al. |
| 8,854,129 | B2 | 10/2014 | Wilson |
| 8,879,665 | B2 | 11/2014 | Xia et al. |
| 8,913,690 | B2 | 12/2014 | Onishi |
| 8,942,651 | B2 | 1/2015 | Jones |
| 8,947,161 | B2 | 2/2015 | Khlat et al. |
| 8,989,682 | B2 | 3/2015 | Ripley et al. |
| 9,018,921 | B2 | 4/2015 | Gurlahosur |
| 9,020,451 | B2 | 4/2015 | Khlat |
| 9,020,453 | B2 | 4/2015 | Briffa et al. |
| 9,041,364 | B2 | 5/2015 | Khlat |
| 9,041,365 | B2 | 5/2015 | Kay et al. |
| 9,055,529 | B2 | 6/2015 | Shih |
| 9,065,509 | B1 | 6/2015 | Yan et al. |
| 9,069,365 | B2 | 6/2015 | Brown et al. |
| 9,098,099 | B2 | 8/2015 | Park et al. |
| 9,166,538 | B2 | 10/2015 | Hong et al. |
| 9,166,830 | B2 | 10/2015 | Camuffo et al. |
| 9,167,514 | B2 | 10/2015 | Dakshinamurthy et al. |
| 9,172,303 | B2 | 10/2015 | Vasadi et al. |
| 9,197,182 | B2 | 11/2015 | Baxter et al. |
| 9,225,362 | B2 | 12/2015 | Drogi et al. |
| 9,247,496 | B2 | 1/2016 | Khlat |
| 9,263,997 | B2 | 2/2016 | Vinayak |
| 9,270,230 | B2 | 2/2016 | Henshaw et al. |
| 9,270,239 | B2 | 2/2016 | Drogi et al. |
| 9,271,236 | B2 | 2/2016 | Drogi |
| 9,280,163 | B2 | 3/2016 | Kay et al. |
| 9,288,098 | B2 | 3/2016 | Yan et al. |
| 9,298,198 | B2 | 3/2016 | Kay et al. |
| 9,344,304 | B1 | 5/2016 | Cohen |
| 9,356,512 | B2 | 5/2016 | Chowdhury et al. |
| 9,362,868 | B2 | 6/2016 | Al-Qaq et al. |
| 9,377,797 | B2 | 6/2016 | Kay et al. |
| 9,379,667 | B2 | 6/2016 | Khlat et al. |
| 9,445,371 | B2 | 9/2016 | Khesbak et al. |
| 9,491,314 | B2 | 11/2016 | Wimpenny |
| 9,515,622 | B2 | 12/2016 | Nentwig et al. |
| 9,520,907 | B2 | 12/2016 | Peng et al. |
| 9,584,071 | B2 | 2/2017 | Khlat |
| 9,595,869 | B2 | 3/2017 | Lerdworatawee |
| 9,595,981 | B2 | 3/2017 | Khlat |
| 9,596,110 | B2 | 3/2017 | Jiang et al. |
| 9,614,477 | B1 | 4/2017 | Rozenblit et al. |
| 9,634,666 | B2 | 4/2017 | Krug |
| 9,705,451 | B2 | 7/2017 | Takenaka et al. |
| 9,748,845 | B1 | 8/2017 | Kotikalapoodi |
| 9,768,731 | B2 | 9/2017 | Perreault et al. |
| 9,806,676 | B2 | 10/2017 | Balteanu et al. |
| 9,831,834 | B2 | 11/2017 | Balteanu et al. |
| 9,837,962 | B2 | 12/2017 | Mathe et al. |
| 9,900,204 | B2 | 2/2018 | Levesque et al. |
| 9,912,297 | B2 | 3/2018 | Khlat |
| 9,923,520 | B1 | 3/2018 | Abdelfattah et al. |
| 10,003,416 | B1 | 6/2018 | Lloyd |
| 10,084,376 | B2 | 9/2018 | Lofthouse |
| 10,090,808 | B1 | 10/2018 | Henzler et al. |
| 10,090,809 | B1 | 10/2018 | Khlat |
| 10,097,145 | B1 | 10/2018 | Khlat et al. |
| 10,103,693 | B2 | 10/2018 | Zhu et al. |
| 10,110,169 | B2 | 10/2018 | Khesbak et al. |
| 10,116,470 | B2 | 10/2018 | Gu et al. |
| 10,158,329 | B1 | 12/2018 | Khla |
| 10,158,330 | B1 | 12/2018 | Khlat |
| 10,170,989 | B2 | 1/2019 | Balteanu et al. |
| 10,284,412 | B2 | 5/2019 | Khlat et al. |
| 10,291,126 | B1 | 5/2019 | Wei et al. |
| 10,291,181 | B2 | 5/2019 | Kim et al. |
| 10,326,408 | B2 | 6/2019 | Khlat et al. |
| 10,355,678 | B2 | 7/2019 | Ye et al. |
| 10,361,744 | B1 | 7/2019 | Khlat |
| 10,381,983 | B2 | 8/2019 | Balteanu et al. |
| 10,382,071 | B2 | 8/2019 | Rozek et al. |
| 10,439,557 | B2 | 10/2019 | Khlat et al. |
| 10,476,437 | B2 | 11/2019 | Nag et al. |
| 10,622,900 | B1 | 4/2020 | Wei et al. |
| 10,680,556 | B2 | 6/2020 | Khlat |
| 10,756,675 | B2 | 8/2020 | Leipold et al. |
| 10,862,431 | B1 | 12/2020 | Khlat |
| 10,873,260 | B2 | 12/2020 | Yan et al. |
| 10,879,804 | B2 | 12/2020 | Kim et al. |
| 11,050,433 | B1 | 6/2021 | Melanson et al. |
| 11,121,684 | B2 | 9/2021 | Henzler et al. |
| 11,128,261 | B2 | 9/2021 | Ranta et al. |
| 11,139,780 | B2 | 10/2021 | Khlat |
| 11,558,016 | B2 | 1/2023 | Khlat |
| 11,637,531 | B1 | 4/2023 | Perreault et al. |
| 11,848,564 | B2 | 12/2023 | Jung et al. |
| 2002/0021110 | A1 | 2/2002 | Nakagawa et al. |
| 2002/0157069 | A1 | 10/2002 | Ogawa et al. |
| 2002/0167827 | A1 | 11/2002 | Umeda et al. |
| 2003/0107428 | A1 | 6/2003 | Khouri et al. |
| 2004/0201281 | A1 | 10/2004 | Ma et al. |
| 2004/0266366 | A1 | 12/2004 | Robinson et al. |
| 2005/0088160 | A1 | 4/2005 | Tanaka et al. |
| 2005/0090209 | A1 | 4/2005 | Behzad |
| 2005/0227646 | A1 | 10/2005 | Yamazaki et al. |
| 2005/0232385 | A1 | 10/2005 | Yoshikawa et al. |
| 2006/0028271 | A1 | 2/2006 | Wilson |
| 2006/0055458 | A1 | 3/2006 | Shiikuma et al. |
| 2006/0240786 | A1 | 10/2006 | Liu |
| 2007/0036212 | A1 | 2/2007 | Leung et al. |
| 2007/0052474 | A1 | 3/2007 | Saito |
| 2007/0053217 | A1 | 3/2007 | Darroman |
| 2007/0258602 | A1 | 11/2007 | Vepsalainen et al. |
| 2007/0290748 | A1 | 12/2007 | Woo et al. |
| 2008/0116960 | A1 | 5/2008 | Nakamura |
| 2008/0231115 | A1 | 9/2008 | Cho et al. |
| 2008/0231358 | A1 | 9/2008 | Maemura |
| 2008/0239772 | A1 | 10/2008 | Oraw et al. |
| 2009/0016085 | A1 | 1/2009 | Rader et al. |
| 2009/0045872 | A1 | 2/2009 | Kenington |
| 2009/0191826 | A1 | 7/2009 | Takinami et al. |
| 2010/0019052 | A1 | 1/2010 | Yip |
| 2010/0039321 | A1 | 2/2010 | Abraham |
| 2010/0283534 | A1 | 11/2010 | Pierdomenico |
| 2010/0308919 | A1 | 12/2010 | Adamski et al. |
| 2011/0068757 | A1 | 3/2011 | Xu et al. |
| 2011/0074373 | A1 | 3/2011 | Lin |
| 2011/0136452 | A1 | 6/2011 | Pratt et al. |
| 2011/0148705 | A1 | 6/2011 | Kenington |
| 2011/0175681 | A1 | 7/2011 | Inamori et al. |
| 2011/0199156 | A1 | 8/2011 | Hayakawa |
| 2011/0279179 | A1 | 11/2011 | Vice |
| 2012/0062031 | A1 | 3/2012 | Buthker |
| 2012/0194274 | A1 | 8/2012 | Fowers et al. |
| 2012/0200435 | A1 | 8/2012 | Ngo et al. |
| 2012/0274134 | A1 | 11/2012 | Gasparini et al. |
| 2012/0281597 | A1 | 11/2012 | Khlat et al. |
| 2012/0286576 | A1 | 11/2012 | Jing et al. |

(56) References Cited

U.S. PATENT DOCUMENTS

| 2012/0299645 | A1 | 11/2012 | Southcombe et al. |
| 2012/0299647 | A1 | 11/2012 | Honjo et al. |
| 2012/0313701 | A1* | 12/2012 | Khlat ..................... H02M 3/07 |
| | | | 330/127 |
| 2012/0326691 | A1 | 12/2012 | Kuan et al. |
| 2013/0021827 | A1 | 1/2013 | Ye |
| 2013/0063118 | A1 | 3/2013 | Nguyen et al. |
| 2013/0072139 | A1 | 3/2013 | Kang et al. |
| 2013/0100991 | A1 | 4/2013 | Woo |
| 2013/0127548 | A1 | 5/2013 | Popplewell et al. |
| 2013/0130724 | A1 | 5/2013 | Kumar Reddy et al. |
| 2013/0141064 | A1 | 6/2013 | Kay et al. |
| 2013/0162233 | A1 | 6/2013 | Marty |
| 2013/0176961 | A1 | 7/2013 | Kanamarlapudi et al. |
| 2013/0187711 | A1 | 7/2013 | Goedken et al. |
| 2013/0200865 | A1 | 8/2013 | Wimpenny |
| 2013/0207731 | A1 | 8/2013 | Balteanu |
| 2013/0234513 | A1 | 9/2013 | Bayer |
| 2013/0234692 | A1 | 9/2013 | Liang et al. |
| 2013/0271221 | A1 | 10/2013 | Levesque et al. |
| 2013/0288612 | A1 | 10/2013 | Afsahi et al. |
| 2014/0009226 | A1 | 1/2014 | Severson |
| 2014/0028370 | A1 | 1/2014 | Wimpenny |
| 2014/0028390 | A1 | 1/2014 | Davis |
| 2014/0055197 | A1 | 2/2014 | Khlat et al. |
| 2014/0057684 | A1 | 2/2014 | Khlat |
| 2014/0097820 | A1 | 4/2014 | Miyamae |
| 2014/0103995 | A1 | 4/2014 | Langer |
| 2014/0145692 | A1 | 5/2014 | Miyamae |
| 2014/0155002 | A1 | 6/2014 | Dakshinamurthy et al. |
| 2014/0169427 | A1 | 6/2014 | Asensio et al. |
| 2014/0184335 | A1 | 7/2014 | Nobbe et al. |
| 2014/0199949 | A1 | 7/2014 | Nagode et al. |
| 2014/0203869 | A1 | 7/2014 | Khlat et al. |
| 2014/0210550 | A1 | 7/2014 | Mathe et al. |
| 2014/0213196 | A1 | 7/2014 | Langer et al. |
| 2014/0218109 | A1 | 8/2014 | Wimpenny |
| 2014/0235185 | A1 | 8/2014 | Drogi |
| 2014/0266423 | A1 | 9/2014 | Drogi et al. |
| 2014/0266428 | A1 | 9/2014 | Chiron et al. |
| 2014/0315504 | A1 | 10/2014 | Sakai et al. |
| 2014/0361830 | A1 | 12/2014 | Mathe et al. |
| 2014/0361837 | A1 | 12/2014 | Strange et al. |
| 2015/0048883 | A1 | 2/2015 | Vinayak |
| 2015/0071382 | A1 | 3/2015 | Wu et al. |
| 2015/0098523 | A1 | 4/2015 | Lim et al. |
| 2015/0139358 | A1 | 5/2015 | Asuri et al. |
| 2015/0145600 | A1 | 5/2015 | Hur et al. |
| 2015/0155836 | A1 | 6/2015 | Midya et al. |
| 2015/0188432 | A1 | 7/2015 | Vannorsdel et al. |
| 2015/0234402 | A1 | 8/2015 | Kay et al. |
| 2015/0236652 | A1 | 8/2015 | Yang et al. |
| 2015/0236654 | A1 | 8/2015 | Jiang et al. |
| 2015/0236729 | A1 | 8/2015 | Peng et al. |
| 2015/0236877 | A1 | 8/2015 | Peng et al. |
| 2015/0280652 | A1 | 10/2015 | Cohen |
| 2015/0302845 | A1 | 10/2015 | Nakano et al. |
| 2015/0311791 | A1 | 10/2015 | Tseng et al. |
| 2015/0326114 | A1 | 11/2015 | Rolland |
| 2015/0333781 | A1 | 11/2015 | Alon et al. |
| 2016/0050629 | A1 | 2/2016 | Khesbak et al. |
| 2016/0065137 | A1 | 3/2016 | Khlat |
| 2016/0065139 | A1 | 3/2016 | Lee et al. |
| 2016/0099686 | A1 | 4/2016 | Perreault et al. |
| 2016/0099687 | A1 | 4/2016 | Khlat |
| 2016/0105151 | A1 | 4/2016 | Langer |
| 2016/0118941 | A1 | 4/2016 | Wang |
| 2016/0126900 | A1 | 5/2016 | Shute |
| 2016/0164550 | A1 | 6/2016 | Pilgram |
| 2016/0164551 | A1 | 6/2016 | Khlat et al. |
| 2016/0173031 | A1 | 6/2016 | Langer |
| 2016/0181995 | A1 | 6/2016 | Nentwig et al. |
| 2016/0187627 | A1 | 6/2016 | Abe |
| 2016/0197627 | A1 | 7/2016 | Qin et al. |
| 2016/0226448 | A1 | 8/2016 | Wimpenny |
| 2016/0249300 | A1 | 8/2016 | Tsai et al. |
| 2016/0294587 | A1 | 10/2016 | Jiang et al. |
| 2017/0005619 | A1 | 1/2017 | Khlat |
| 2017/0005676 | A1 | 1/2017 | Yan et al. |
| 2017/0006543 | A1 | 1/2017 | Khlat |
| 2017/0012675 | A1 | 1/2017 | Frederick |
| 2017/0018718 | A1 | 1/2017 | Jang et al. |
| 2017/0141736 | A1 | 5/2017 | Pratt et al. |
| 2017/0149240 | A1 | 5/2017 | Wu et al. |
| 2017/0187187 | A1 | 6/2017 | Amin et al. |
| 2017/0288612 | A1 | 10/2017 | Khlat et al. |
| 2017/0302183 | A1 | 10/2017 | Young |
| 2017/0317913 | A1 | 11/2017 | Kim et al. |
| 2017/0331433 | A1 | 11/2017 | Khlat |
| 2017/0338773 | A1 | 11/2017 | Balteanu et al. |
| 2018/0013465 | A1 | 1/2018 | Chiron et al. |
| 2018/0048265 | A1 | 2/2018 | Nentwig |
| 2018/0048276 | A1 | 2/2018 | Khlat et al. |
| 2018/0076772 | A1 | 3/2018 | Khesbak et al. |
| 2018/0123453 | A1 | 5/2018 | Puggelli et al. |
| 2018/0123516 | A1 | 5/2018 | Kim et al. |
| 2018/0152144 | A1 | 5/2018 | Choo et al. |
| 2018/0254530 | A1 | 9/2018 | Wigney |
| 2018/0288697 | A1 | 10/2018 | Camuffo et al. |
| 2018/0302042 | A1 | 10/2018 | Zhang et al. |
| 2018/0309409 | A1 | 10/2018 | Khlat |
| 2018/0309414 | A1 | 10/2018 | Khlat et al. |
| 2018/0367101 | A1 | 12/2018 | Chen et al. |
| 2018/0375476 | A1 | 12/2018 | Balteanu et al. |
| 2018/0375483 | A1 | 12/2018 | Balteanu et al. |
| 2019/0028060 | A1 | 1/2019 | Jo et al. |
| 2019/0044480 | A1 | 2/2019 | Khlat |
| 2019/0068051 | A1 | 2/2019 | Yang et al. |
| 2019/0068234 | A1 | 2/2019 | Khlat et al. |
| 2019/0097277 | A1 | 3/2019 | Fukae |
| 2019/0103766 | A1 | 4/2019 | Von Novak, III et al. |
| 2019/0109566 | A1 | 4/2019 | Folkmann et al. |
| 2019/0109613 | A1 | 4/2019 | Khiat et al. |
| 2019/0181804 | A1 | 6/2019 | Khlat |
| 2019/0199215 | A1 | 6/2019 | Zhao et al. |
| 2019/0222175 | A1 | 7/2019 | Khlat et al. |
| 2019/0222178 | A1 | 7/2019 | Khlat et al. |
| 2019/0229623 | A1 | 7/2019 | Tsuda et al. |
| 2019/0238095 | A1 | 8/2019 | Khlat |
| 2019/0253023 | A1 | 8/2019 | Yang et al. |
| 2019/0267956 | A1 | 8/2019 | Granger-Jones et al. |
| 2019/0288645 | A1 | 9/2019 | Nag et al. |
| 2019/0319584 | A1 | 10/2019 | Khlat et al. |
| 2019/0334480 | A1* | 10/2019 | Nomiyama ............... H03F 3/19 |
| 2019/0386565 | A1 | 12/2019 | Rosolowski et al. |
| 2020/0007090 | A1 | 1/2020 | Khlat et al. |
| 2020/0036337 | A1 | 1/2020 | Khlat |
| 2020/0091878 | A1 | 3/2020 | Maxim et al. |
| 2020/0106392 | A1 | 4/2020 | Khlat et al. |
| 2020/0127608 | A1 | 4/2020 | Khlat |
| 2020/0127625 | A1 | 4/2020 | Khlat |
| 2020/0127730 | A1 | 4/2020 | Khlat |
| 2020/0136561 | A1 | 4/2020 | Khlat et al. |
| 2020/0136563 | A1 | 4/2020 | Khlat |
| 2020/0136575 | A1 | 4/2020 | Khlat et al. |
| 2020/0144966 | A1 | 5/2020 | Khlat |
| 2020/0153394 | A1 | 5/2020 | Khlat et al. |
| 2020/0177131 | A1 | 6/2020 | Khlat |
| 2020/0204116 | A1 | 6/2020 | Khlat |
| 2020/0228063 | A1 | 7/2020 | Khlat |
| 2020/0259456 | A1 | 8/2020 | Khlat |
| 2020/0259685 | A1 | 8/2020 | Khlat |
| 2020/0266766 | A1 | 8/2020 | Khlat et al. |
| 2020/0304020 | A1 | 9/2020 | Lu et al. |
| 2020/0313622 | A1 | 10/2020 | Eichler et al. |
| 2020/0321848 | A1 | 10/2020 | Khlat |
| 2020/0321917 | A1 | 10/2020 | Nomiyama et al. |
| 2020/0328677 | A1 | 10/2020 | Amin et al. |
| 2020/0328720 | A1 | 10/2020 | Khlat |
| 2020/0336105 | A1 | 10/2020 | Khlat |
| 2020/0336111 | A1 | 10/2020 | Khlat |
| 2020/0350865 | A1 | 11/2020 | Khlat |
| 2020/0350866 | A1 | 11/2020 | Pehlke |
| 2020/0350878 | A1 | 11/2020 | Drogi et al. |

(56) References Cited

U.S. PATENT DOCUMENTS

| | | | |
|---|---|---|---|
| 2020/0382061 A1 | 12/2020 | Khlat |
| 2020/0382066 A1 | 12/2020 | Khlat |
| 2021/0036596 A1 | 2/2021 | Jeon et al. |
| 2021/0036604 A1 | 2/2021 | Khlat et al. |
| 2021/0075372 A1 | 3/2021 | Henzler et al. |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194437 A1 | 6/2021 | Stockert |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0257971 A1 | 8/2021 | Kim et al. |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2022/0021348 A1 | 1/2022 | Philpott et al. |
| 2022/0094256 A1 | 3/2022 | Radhakrishnan et al. |
| 2022/0123697 A1 | 4/2022 | Elgaard et al. |
| 2022/0123698 A1 | 4/2022 | Goto et al. |
| 2022/0123744 A1 | 4/2022 | Khlat |
| 2022/0181974 A1 | 6/2022 | Liu et al. |
| 2022/0224294 A1 | 7/2022 | Khlat et al. |
| 2022/0263474 A1 | 8/2022 | Khlat |
| 2022/0278651 A1 | 9/2022 | Khlat |
| 2022/0286094 A1 | 9/2022 | Granger-Jones et al. |
| 2022/0385239 A1 | 12/2022 | Khlat |
| 2022/0399861 A1 | 12/2022 | Khlat |
| 2023/0113677 A1 | 4/2023 | Boley et al. |
| 2024/0014782 A1 | 1/2024 | Khlat |

FOREIGN PATENT DOCUMENTS

| | | | |
|---|---|---|---|
| CN | 104185953 A | 12/2014 |
| CN | 104620509 A | 5/2015 |
| CN | 104954301 A | 9/2015 |
| CN | 105322894 A | 2/2016 |
| CN | 105680807 A | 6/2016 |
| CN | 105703716 A | 6/2016 |
| CN | 105721366 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 107980205 A | 5/2018 |
| CN | 108141184 A | 6/2018 |
| CN | 109150212 A | 1/2019 |
| CN | 109478870 A | 3/2019 |
| DE | 102019220150 A1 | 6/2020 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Notice of Allowance for U.S. Appl. No. 17/363,568, mailed Apr. 17, 2024, 6 pages.
Notice of Allowance for U.S. Appl. No. 17/331,996, mailed Jun. 14, 2024, 9 pages.
Notice of Allowance for U.S. Appl. No. 17/351,560, mailed Apr. 19, 2024, 8 pages.
International Search Report and Written Opinion for International Patent Application No. PCT/US2023/085103, mailed Apr. 26, 2024, 17 pages.
Non-Final Office Action for U.S. Appl. No. 17/363,568, mailed Nov. 9, 2023, 8 pages.
Decision to Grant for Chinese Patent Application No. 202010083654. 0, mailed Sep. 11, 2023, 8 pages.
Ma, Hongyan, "Application and implementation of envelope tracking technology in mobile terminal RF power amplifier," Computers and Telecommunications, Oct. 2017, 18 pages.
First Office Action for Chinese Patent Application No. 201910092452. X, mailed Jul. 31, 2024, 17 pages.
First Office Action for Chinese Patent Application No. 201910512645. 6, mailed Jul. 3, 2024, 15 pages.
First Office Action for Chinese Patent Application No. 201911232472. 9, mailed Jul. 23, 2024, 10 pages.
First Office Action for Chinese Patent Application No. 201911312703. 7, mailed Jul. 16, 2024, 10 pages.
Non-Final Office Action for U.S. Patent Application No. 18/254, 155, mailed Sep. 4, 2024, 14 pages.
Corrected Notice of Allowability for U.S. Appl. No. 17/331,996, mailed Aug. 1, 2024, 6 pages.
Non-Final Office Action for U.S. Appl. No. 17/579,796, mailed Aug. 30, 2024, 6 pages.
Notice of Allowance for U.S. Appl. No. 17/363,568, mailed Sep. 19, 2024, 6 pages.
Non-Final Office Action for U.S. Appl. No. 14/836,634, mailed May 16, 2016, 9 pages.
Non-Final Office Action for U.S. Appl. No. 14/868,890, mailed Jul. 14, 2016, 13 pages.
Non-Final Office Action for U.S. Appl. No. 15/792,909, mailed May 18, 2018, 13 pages.
Notice of Allowance for U.S. Appl. No. 15/459,449, mailed Mar. 28, 2018, 7 pages.
Notice of Allowance for U.S. Appl. No. 15/723,460, mailed Jul. 24, 2018, 8 pages.
Notice of Allowance for U.S. Appl. No. 15/704,131, mailed Jul. 17, 2018, 7 pages.
Notice of Allowance for U.S. Appl. No. 15/728,202, mailed Aug. 2, 2018, 7 pages.
Non-Final Office Action for U.S. Appl. No. 15/888,300, mailed Aug. 28, 2018, 11 pages.
Notice of Allowance for U.S. Appl. No. 15/792,909, mailed Dec. 19, 2018, 11 pages.
Notice of Allowance for U.S. Appl. No. 15/993,705, mailed Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, mailed May 2, 2019, 14 pages.
Non-Final Office Action for U.S. Appl. No. 15/986,948, mailed Mar. 28, 2019, 8 pages.
Non-Final Office Action for U.S. Appl. No. 16/018,426, mailed Apr. 11, 2019, 11 pages.
Supplemental Notice of Allowability for U.S. Appl. No. 15/902,244, mailed Mar. 20, 2019, 6 pages.
Notice of Allowance for U.S. Appl. No. 15/902,244, mailed Feb. 8, 2019, 8 pages.
Advisory Action for U.S. Appl. No. 15/888,300, mailed Jun. 5, 2019, 3 pages.
Notice of Allowance for U.S. Appl. No. 15/984,566, mailed May 21, 2019, 6 pages.
Notice of Allowance for U.S. Appl. No. 16/150,556, mailed Jul. 29, 2019, 7 pages.
Non-Final Office Action for U.S. Appl. No. 15/888,300, mailed Jun. 27, 2019, 17 pages.
Final Office Action for U.S. Appl. No. 15/986,948, mailed Aug. 27, 2019, 9 pages.
Advisory Action for U.S. Appl. No. 15/986,948, mailed Nov. 8, 2019, 3 pages.
Notice of Allowance for U.S. Appl. No. 15/986,948, mailed Dec. 13, 2019, 7 pages.

(56) References Cited

OTHER PUBLICATIONS

Final Office Action for U.S. Appl. No. 16/018,426, mailed Sep. 4, 2019, 12 pages.

Advisory Action for U.S. Appl. No. 16/018,426, mailed Nov. 19, 2019, 3 pages.

Notice of Allowance for U.S. Appl. No. 16/180,887, mailed Jan. 13, 2020, 8 pages.

Notice of Allowance for U.S. Appl. No. 15/888,300, mailed Jan. 14, 2020, 11 pages.

Non-Final Office Action for U.S. Appl. No. 16/122,611, mailed Mar. 11, 2020, 16 pages.

Corrected Notice of Allowability for U.S. Appl. No. 15/888,300, mailed Feb. 25, 2020, 7 pages.

Notice of Allowance for U.S. Appl. No. 16/018,426, mailed Mar. 31, 2020, 7 pages.

Non-Final Office Action for U.S. Appl. No. 16/174,535, mailed Feb. 4, 2020, 7 pages.

Quayle Action for U.S. Appl. No. 16/354,234, mailed Mar. 6, 2020, 8 pages.

Notice of Allowance for U.S. Appl. No. 16/354,234, mailed Apr. 24, 2020, 9 pages.

Non-Final Office Action for U.S. Appl. No. 16/246,859, mailed Apr. 28, 2020, 9 pages.

Corrected Notice of Allowability for U.S. Appl. No. 15/888,300, mailed May 13, 2020, 7 pages.

Notice of Allowance for U.S. Appl. No. 16/155,127, mailed Jun. 1, 2020, 8 pages.

Final Office Action for U.S. Appl. No. 16/174,535, mailed Jul. 1, 2020, 7 pages.

Non-Final Office Action for U.S. Appl. No. 16/284,023, mailed Jun. 24, 2020, 7 pages.

Non-Final Office Action for U.S. Appl. No. 16/435,940, mailed Jul. 23, 2020, 6 pages.

Final Office Action for U.S. Appl. No. 15/888,300, mailed Feb. 15, 2019, 15 pages.

Final Office Action for U.S. Appl. No. 16/122,611, mailed Sep. 18, 2020, 17 pages.

Advisory Action for U.S. Appl. No. 16/174,535, mailed Sep. 24, 2020, 3 pages.

Notice of Allowance for U.S. Appl. No. 16/174,535, mailed Oct. 29, 2020, 7 pages.

Notice of Allowance for U.S. Appl. No. 16/246,859, mailed Sep. 18, 2020, 8 pages.

Final Office Action for U.S. Appl. No. 16/284,023, mailed Nov. 3, 2020, 7 pages.

Quayle Action for U.S. Appl. No. 16/421,905, mailed Aug. 25, 2020, 5 pages.

Non-Final Office Action for U.S. Appl. No. 16/416,812, mailed Oct. 16, 2020, 8 pages.

Non-Final Office Action for U.S. Appl. No. 16/514,051, mailed Nov. 13, 2020, 9 pages.

Non-Final Office Action for U.S. Appl. No. 16/774,060, mailed Aug. 17, 2020, 6 pages.

Notice of Allowance for U.S. Appl. No. 16/122,611, mailed Dec. 1, 2020, 9 pages.

Notice of Allowance for U.S. Appl. No. 17/163,642, mailed Mar. 1, 2023, 10 pages.

Final Office Action for U.S. Appl. No. 17/032,553, mailed Jul. 29, 2022, 6 pages.

Notice of Allowance for U.S. Appl. No. 17/032,553, mailed Oct. 11, 2022, 7 pages.

Final Office Action for U.S. Appl. No. 17/073,764, mailed Jun. 1, 2022, 22 pages.

Advisory Action for U.S. Appl. No. 17/073,764, mailed Aug. 23, 2022, 3 pages.

Non-Final Office Action for U.S. Appl. No. 17/073,764, mailed Sep. 30, 2022, 13 pages.

Final Office Action for U.S. Appl. No. 17/073,764, mailed Mar. 3, 2023, 14 pages.

Advisory Action for U.S. Appl. No. 17/073,764, mailed May 26, 2023, 3 pages.

Extended European Search Report for European Patent Application No. 22153526.3, mailed Jul. 13, 2022, 9 pages.

Written Opinion for International Patent Application No. PCT/US2021/052830, mailed Nov. 3, 2022, 7 pages.

International Preliminary Report on Patentability for International Patent Application No. PCT/US2021/052830, mailed Feb. 20, 2023, 21 pages.

Quayle Action for U.S. Appl. No. 16/589,940, mailed Dec. 4, 2020, 8 pages.

Notice of Allowance for U.S. Appl. No. 16/122,611, mailed Jan. 13, 2021, 8 pages.

Notice of Allowance for U.S. Appl. No. 16/284,023, mailed Jan. 19, 2021, 7 pages.

Notice of Allowance for U.S. Appl. No. 16/416,812, mailed Feb. 16, 2021, 8 pages.

Non-Final Office Action for U.S. Appl. No. 16/689,236 mailed Mar. 2, 2021, 15 pages.

Notice of Allowance for U.S. Appl. No. 16/435,940, mailed Dec. 21, 2020, 7 pages.

Notice of Allowance for U.S. Appl. No. 16/774,060, mailed Feb. 3, 2021, 7 pages.

Notice of Allowance for U.S. Appl. No. 16/590,790, mailed Jan. 27, 2021, 7 pages.

Notice of Allowance for U.S. Appl. No. 16/661,061, mailed Feb. 10, 2021, 7 pages.

Notice of Allowance for U.S. Appl. No. 16/122,611, mailed Apr. 1, 2021, 8 pages.

Non-Final Office Action for U.S. Appl. No. 16/582,471, mailed Mar. 24, 2021, 11 pages.

Wan, F. et al., "Negative Group Delay Theory of a Four-Port RC-Network Feedback Operational Amplifier," IEEE Access, vol. 7, Jun. 13, 2019, IEEE, 13 pages.

Notice of Allowance for U.S. Appl. No. 16/689,236 mailed Jun. 9, 2021, 7 pages.

Non-Final Office Action for U.S. Appl. No. 16/775,554, mailed Jun. 14, 2021, 5 pages.

Notice of Allowance for U.S. Appl. No. 16/582,471, mailed Jun. 22, 2021, 9 pages.

Non-Final Office Action for U.S. Appl. No. 16/597,952, mailed May 26, 2021, 7 pages.

Notice of Allowance for U.S. Appl. No. 16/834,049, mailed Jun. 24, 2021, 8 pages.

Chen, S et al., "A 4.5 μW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.

Ying, K. et al., "A Wideband Envelope Detector with Low Ripple and High Detection Speed," 2018 IEEE International Symposium on Circuits and Systems (ISCAS), May 27-30, 2018, IEEE, 5 pages.

Notice of Allowance for U.S. Appl. No. 17/011,313, mailed Nov. 4, 2021, 8 pages.

Notice of Allowance for U.S. Appl. No. 16/582,471, mailed Feb. 1, 2022, 9 pages.

Non-Final Office Action for U.S. Appl. No. 16/597,952, mailed Nov. 10, 2021, 9 pages.

Quayle Action for U.S. Appl. No. 16/855,154, mailed Oct. 25, 2021, 6 pages.

Non-Final Office Action for U.S. Appl. No. 16/807,575, mailed Jan. 31, 2022, 12 pages.

International Search Report and Written Opinion for International Patent Application No. PCT/US2021/050892, mailed Jan. 5, 2022, 20 pages.

International Search Report and Written Opinion for International Patent Application No. PCT/US2021/052151, mailed Jan. 4, 2022, 16 pages.

International Search Report and Written Opinion for International Patent Application No. PCT/US2021/054141 mailed Jan. 25, 2022, 15 pages.

Notice of Allowance for U.S. Appl. No. 17/115,982, mailed Nov. 12, 2021, 8 pages.

(56)        References Cited

OTHER PUBLICATIONS

Non-Final Office Action for U.S. Appl. No. 17/126,561, mailed Oct. 14, 2021, 6 pages.
Non-Final Office Action for U.S. Appl. No. 17/032,553, mailed Mar. 21, 2022, 4 pages.
Non-Final Office Action for U.S. Appl. No. 17/073,764, mailed Dec. 24, 2021, 22 pages.
International Search Report and Written Opinion for International Patent Application No. PCT/US2021/052830, mailed Jan. 24, 2022, 13 pages.
Notice of Allowance for U.S. Appl. No. 15/964,762, mailed Mar. 18, 2019, 7 pages.
Non-Final Office Action for U.S. Appl. No. 16/263,316, mailed Dec. 23, 2019, 10 pages.
Final Office Action for U.S. Appl. No. 16/263,316, mailed May 13, 2020, 10 pages.
Non-Final Office Action for U.S. Appl. No. 16/263,316, mailed Jul. 17, 2020, 4 pages.
Non-Final Office Action for U.S. Appl. No. 16/263,316, mailed Nov. 24, 2020, 4 pages.
Notice of Allowance for U.S. Appl. No. 16/263,316, mailed Mar. 30, 2021, 7 pages.
First Office Action for Chinese Patent Application No. 202010083654.0, mailed May 12, 2023, 17 pages.
Notification to Grant for Chinese Patent Application No. 202010097807.7, mailed Jul. 11, 2023, 14 pages.
Final Office Action for U.S. Appl. No. 16/807,575, mailed May 4, 2022, 12 pages.
Advisory Action for U.S. Appl. No. 16/807,575, mailed Jul. 28, 2022, 3 pages.
Notice of Allowance for U.S. Appl. No. 16/807,575, mailed Aug. 19, 2022, 8 pages.
International Preliminary Report on Patentability for International Patent Application No. PCT/US2021/050892, mailed Oct. 24, 2022, 20 pages.
International Preliminary Report on Patentability for International Patent Application No. PCT/US2021/052151, mailed Oct. 13, 2022, 21 pages.
International Preliminary Report on Patentability for International Patent Application No. PCT/US2021/054141, mailed Sep. 29, 2022, 20 pages.
Notice of Allowance for U.S. Appl. No. 17/148,064, mailed Aug. 18, 2022, 8 pages.
Non-Final Office Action for U.S. Appl. No. 17/146,765, mailed Sep. 7, 2022, 10 pages.
Non-Final Office Action for U.S. Appl. No. 17/163,642, mailed Aug. 17, 2022, 9 pages.
Final Office Action for U.S. Appl. No. 17/163,642, mailed Nov. 25, 2022, 13 pages.
Notice of Allowance for U.S. Appl. No. 18/039,805, mailed Sep. 26, 2024, 10 pages.
Corrected Notice of Allowability and Response to Rule 312 Communication for U.S. Appl. No. 18/039,805, mailed Nov. 21, 2024, 5 pages.
Office Action for Taiwanese U.S. Appl. No. 11/014,251, mailed Jul. 7, 2025, 22 pages.
Notification to Grant for Chinese Patent Application No. 202010083654.0, mailed Nov. 9, 2023, 8 pages.
Notice of Allowance for U.S. Appl. No. 17/363,568, mailed Jan. 3, 2024, 7 pages.
Non-Final Office Action for U.S. Appl. No. 17/343,912, mailed Dec. 14, 2023, 6 pages.
Quayle Action for U.S. Appl. No. 17/351,560, mailed Nov. 24, 2023, 7 pages.
Notice of Allowance for U.S. Appl. No. 17/351,560, mailed Jan. 4, 2024, 7 pages.
Notice of Allowance for U.S. Appl. No. 17/073,764, mailed Aug. 23, 2023, 12 pages.
Examination Report for European Patent Application No. 21790723.7, mailed Mar. 7, 2024, 5 pages.
Notice of Allowance for U.S. Appl. No. 17/343,912, mailed Mar. 4, 2024, 7 pages.
Non-Final Office Action for U.S. Appl. No. 17/331,996, mailed Feb. 1, 2024, 9 pages.
Notice of Allowance for U.S. Appl. No. 17/331,996, mailed Mar. 1, 2024, 8 pages.

* cited by examiner

ENVELOPE TRACKING INTEGRATED CIRCUIT OPERABLE ACROSS WIDE MODULATION BANDWIDTH

RELATED APPLICATIONS

This application is a 35 USC 371 national phase filing of International Application No. PCT/US2021/050892, filed Sep. 17, 2021, which claims the benefit of provisional patent application Ser. No. 63/114,185, filed Nov. 16, 2020, the disclosures of which are hereby incorporated herein by reference in their entireties.

FIELD OF THE DISCLOSURE

The present disclosure is related generally to an envelope tracking integrated circuit (ETIC), and particularly to an ETIC operable across a wide modulation bandwidth.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth-generation new-radio (5G-NR) technology configured to communicate a millimeter wave (mmWave) radio frequency (RF) signal(s) in an mmWave spectrum located above 12 GHz frequency. To achieve higher data rates, a mobile communication device may employ a power amplifier(s) to increase output power of the mmWave RF signal(s) (e.g., maintaining sufficient energy per bit). However, the increased output power of mmWave RF signal(s) can lead to increased power consumption and thermal dissipation in the mobile communication device, thus compromising overall performance and user experience.

Envelope tracking (ET) is a power management technology designed to improve efficiency levels of power amplifiers to help reduce power consumption and thermal dissipation in mobile communication devices. In an ET system, a power amplifier(s) amplifies an RF signal(s) based on a time-variant ET voltage(s) generated in accordance with time-variant amplitudes of the RF signal(s). More specifically, the time-variant ET voltage(s) corresponds to a time-variant voltage envelope(s) that tracks (e.g., rises and falls) a time-variant power envelope(s) of the RF signal(s). Understandably, the better the time-variant voltage envelope(s) tracks the time-variant power envelope(s), the higher linearity the power amplifier(s) can achieve.

However, the time-variant ET voltage(s) can be highly susceptible to distortions caused by trace inductance and/or load impedance, particularly when the time-variant ET voltage(s) is generated to track the time-variant power envelope(s) of a high modulation bandwidth (e.g., >200 MHz) RF signal(s). As a result, the time-variant voltage envelope(s) may become misaligned with the time-variant power envelope(s) of the RF signal(s), thus causing unwanted distortions (e.g., amplitude clipping) in the RF signal(s). In this regard, it is desirable to reduce distortions caused by trace inductance and/or load impedance in the time-variant ET voltage(s) across a wide modulation bandwidth.

SUMMARY

Embodiments of the disclosure relate to an envelope tracking (ET) integrated circuit (ETIC) operable across wide modulation bandwidth. The ETIC includes a primary voltage output(s) coupled to a low-bandwidth power amplifier circuit(s) and at least two auxiliary voltage outputs coupled to a high-bandwidth power amplifier circuit. In embodiments disclosed herein, the high-bandwidth power amplifier circuit has a lower equivalent capacitance, and thus a higher impedance resonance frequency, than the low-bandwidth power amplifier circuit(s). The ETIC also includes a pair of ET voltage circuits configured to generate a pair of ET voltages, respectively. To help mitigate potential distortion in the ET voltages, a control circuit is configured to couple the ET voltage circuits exclusively to the auxiliary voltage outputs when the ETIC needs to operate with a high modulation bandwidth (e.g., ≥200 MHz). Given the higher impedance resonance frequency of the high-bandwidth power amplifier circuit, it is possible to increase separation between an energy spectrum of a voltage disturbance, which is inherently caused by the high-bandwidth power amplifier circuit, and an energy spectrum of the high modulation bandwidth, thus helping to reduce the potential distortion in the ET voltages.

In one aspect, an ETIC is provided. The ETIC includes at least two primary voltage outputs each coupled to a respective one of at least two low-bandwidth power amplifier circuits each having a first equivalent capacitance. The ETIC also includes at least two auxiliary voltage outputs coupled to a high-bandwidth power amplifier circuit having a second equivalent capacitance lower than the first equivalent capacitance. The ETIC also includes a first ET voltage circuit configured to generate a first ET voltage based on a first target voltage. The ETIC also includes a second ET voltage circuit configured to generate a second ET voltage based on a second target voltage. The ETIC also includes a control circuit. The control circuit is configured to determine whether the ETIC needs to operate with a high modulation bandwidth or a low modulation bandwidth. The control circuit is also configured to couple each of the first ET voltage circuit and the second ET voltage circuit to a respective one of the at least two auxiliary voltage outputs in response to determining that the ETIC needs to operate with the high modulation bandwidth.

In another aspect, an ET power management circuit is provided. The ET power management circuit includes at least two low-bandwidth power amplifier circuits each having a first equivalent capacitance. The ET power management circuit also includes a high-bandwidth power amplifier circuit having a second equivalent capacitance lower than the first equivalent capacitance. The ET power management circuit also includes an ETIC. The ETIC includes at least two primary voltage outputs each coupled to a respective one of the at least two low-bandwidth power amplifier circuits. The ETIC also includes at least two auxiliary voltage outputs coupled to the high-bandwidth power amplifier circuit. The ETIC also includes a first ET voltage circuit configured to generate a first ET voltage based on a first target voltage. The ETIC also includes a second ET voltage circuit configured to generate a second ET voltage based on a second target voltage. The ETIC also includes a control circuit. The control circuit is configured to determine whether the ETIC needs to operate with a high modulation bandwidth or a low modulation bandwidth. The control circuit is also configured to couple each of the first ET voltage circuit and the second ET voltage circuit to a respective one of the at least two auxiliary voltage outputs in response to determining that the ETIC needs to operate with the high modulation bandwidth.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
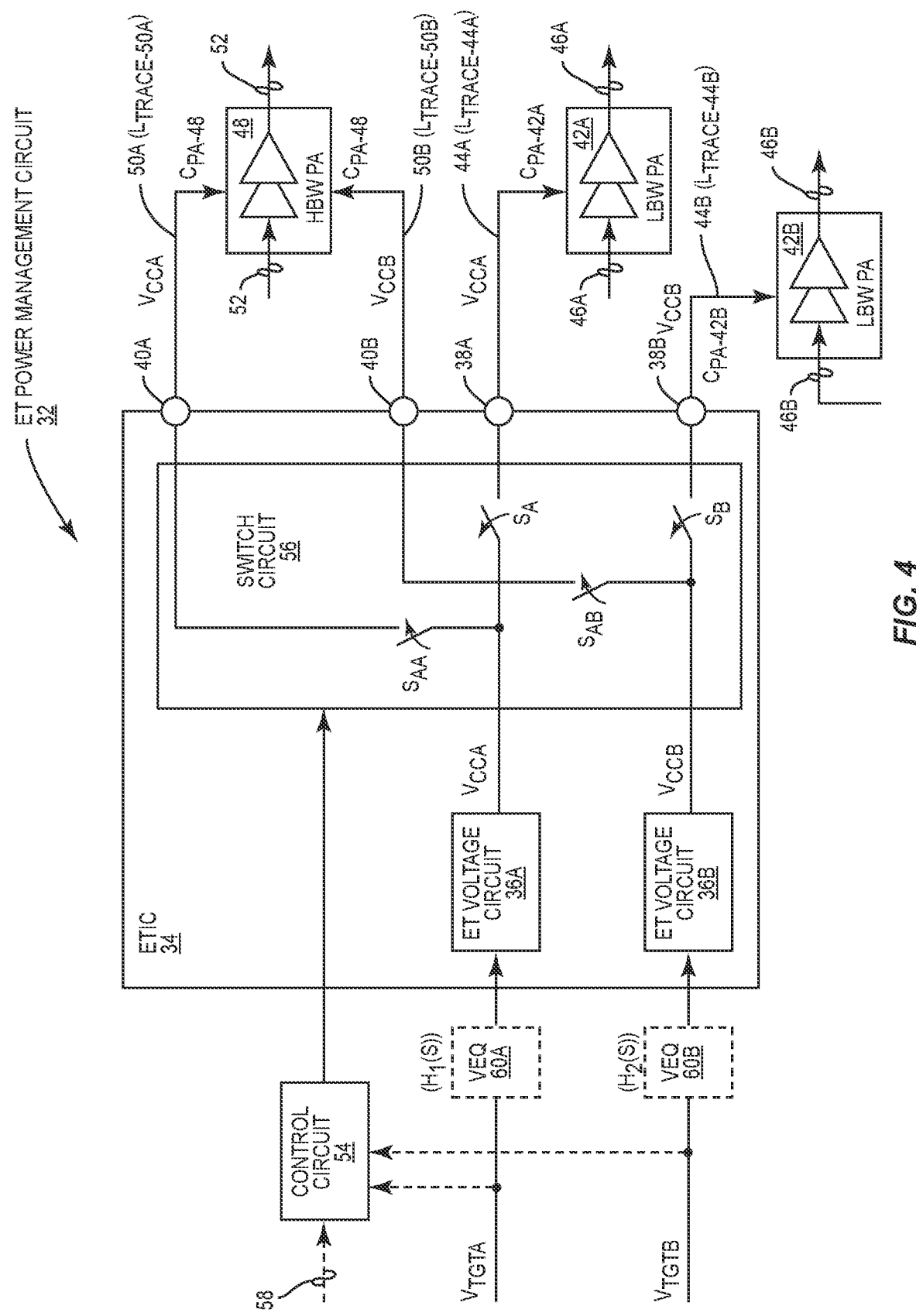
FIG. 4 is a schematic diagram of an exemplary ET power management circuit configured according to embodiments of the present disclosure to operate across a wide modulation bandwidth.
Figure 5:
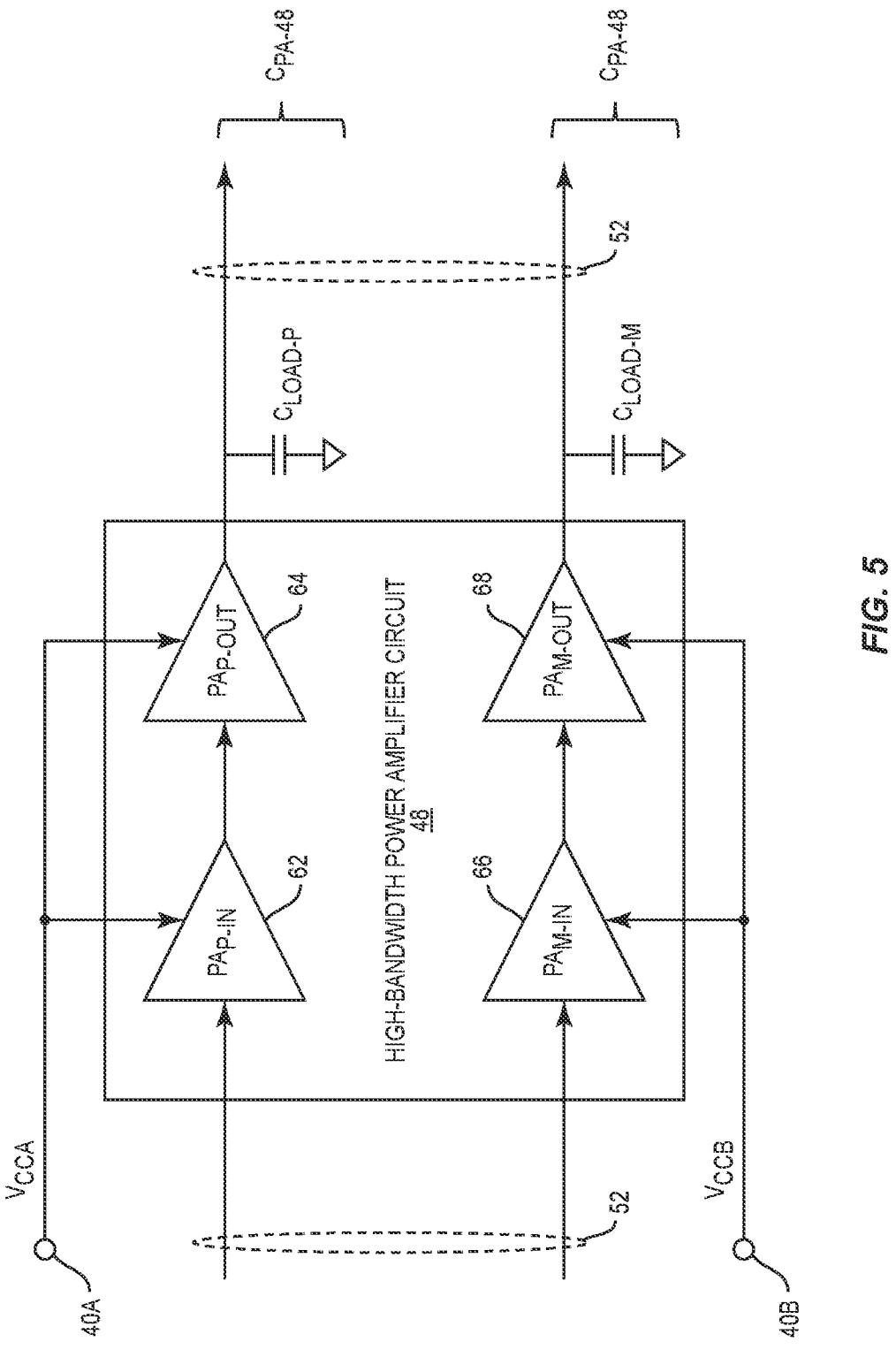
Figure 6:
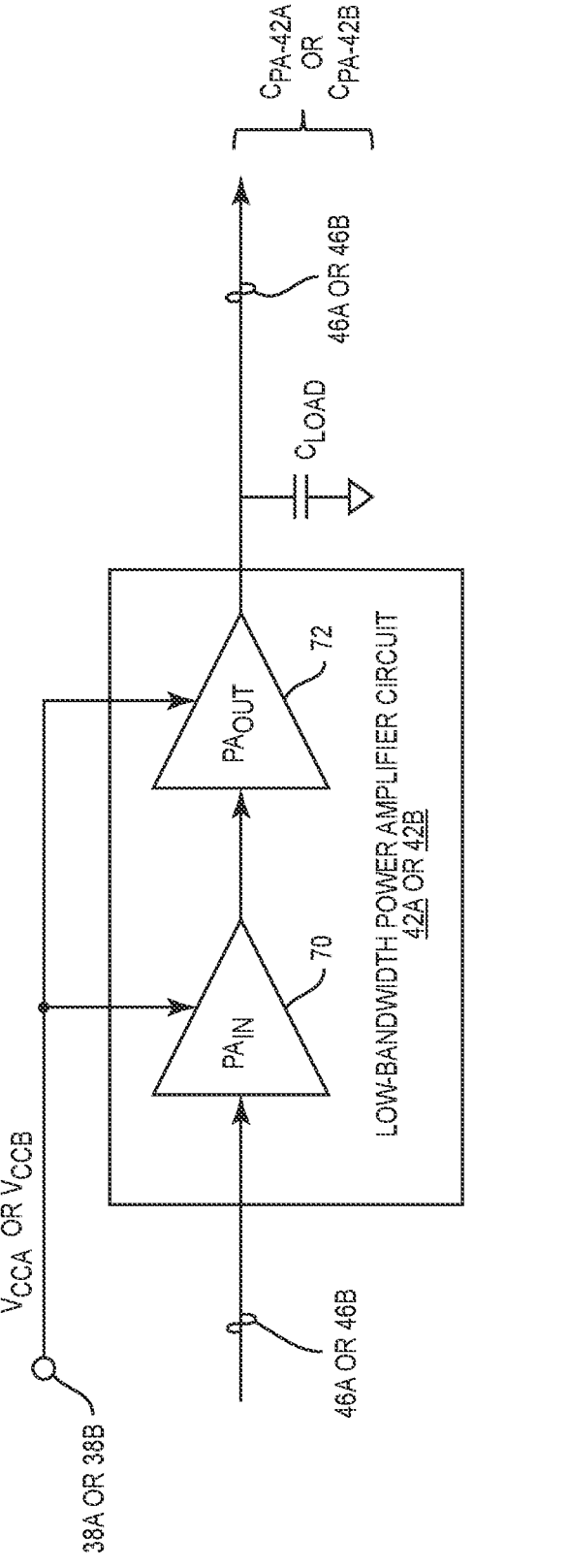

FIG. 5 is a schematic diagram of an exemplary high-bandwidth power amplifier circuit, which can be provided in the ET power management circuit of FIG. 4 to amplify a radio frequency (RF) signal modulated with a high modulation bandwidth; and FIG. 6 is a schematic diagram of an exemplary low-bandwidth power amplifier circuit, which can be provided in the ET power management circuit of FIG. 4 to amplify an RF signal modulated with a low modulation bandwidth.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to an envelope tracking (ET) integrated circuit (ETIC) operable across wide modulation bandwidth. The ETIC includes a primary voltage output(s) coupled to a low-bandwidth power amplifier circuit(s) and at least two auxiliary voltage outputs coupled to a high-bandwidth power amplifier circuit. In embodiments disclosed herein, the high-bandwidth power amplifier circuit has a lower equivalent capacitance, and thus a higher impedance resonance frequency, than the low-bandwidth power amplifier circuit(s). The ETIC also includes a pair of ET voltage circuits configured to generate a pair of ET voltages, respectively. To help mitigate potential distortion in the ET voltages, a control circuit is configured to couple the ET voltage circuits exclusively to the auxiliary voltage outputs when the ETIC needs to operate with a high modulation bandwidth (e.g., ≥200 MHz). Given the higher impedance resonance frequency of the high-bandwidth power amplifier circuit, it is possible to increase separation between an energy spectrum of a voltage disturbance, which is inherently caused by the high-bandwidth power amplifier circuit, and an energy spectrum of the high modulation bandwidth, thus helping to reduce the potential distortion in the ET voltages.

Figure 1:
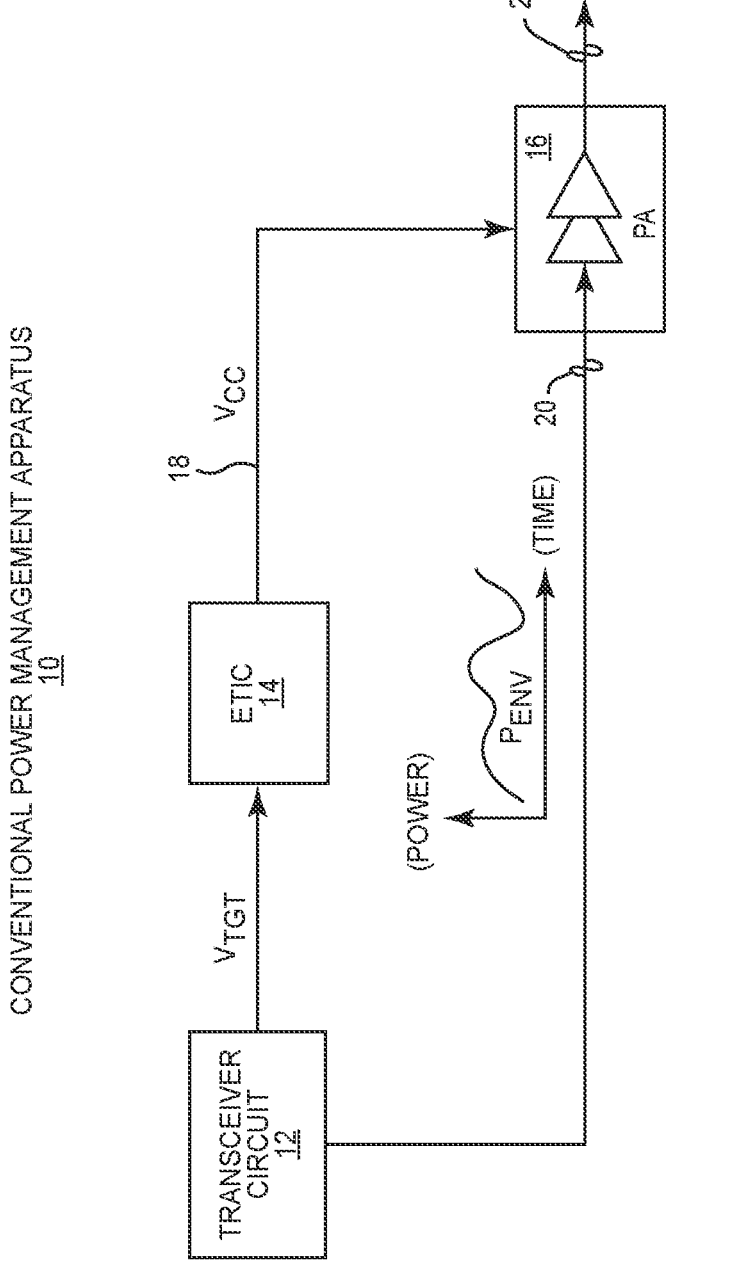
FIG. 1 is a schematic diagram of an exemplary conventional envelope tracking (ET) power amplifier apparatus configured to generate an ET voltage.
Figure 2:
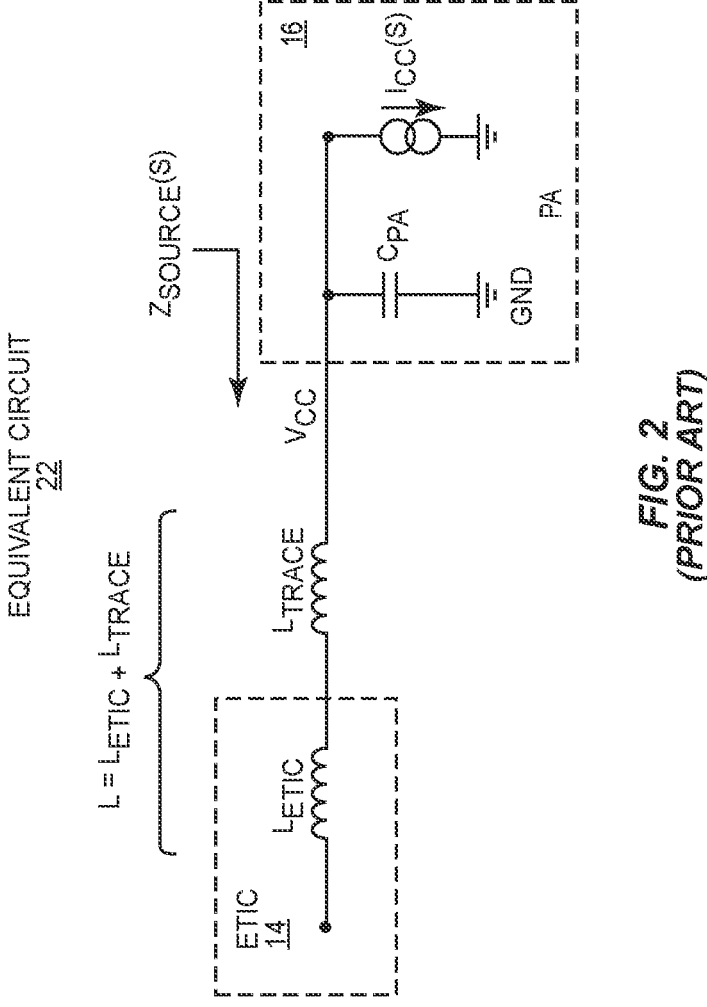
FIG. 2 is a schematic diagram of an exemplary equivalent circuit for illustrating various impedances, capacitances, and/or inductances in the conventional power amplifier apparatus of FIG. 1 that can distort the ET voltage.
Figure 3:
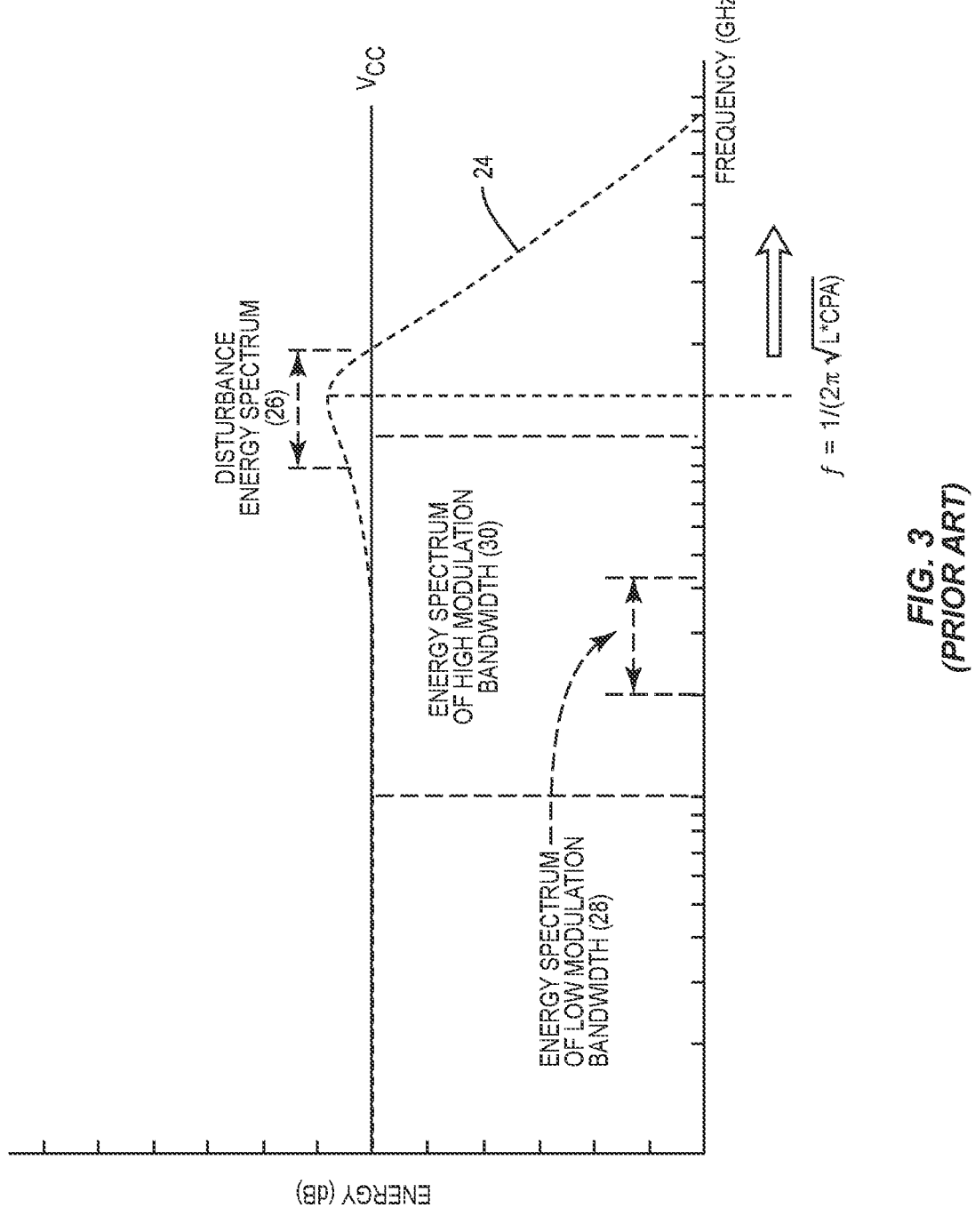
FIG. 3 is a graphic diagram providing an exemplary illustration of factors contributing to a voltage disturbance in the equivalent circuit of FIG. 2 that can distort the ET voltage in FIG. 1.

Before discussing the ETIC incorporated therein according to the present disclosure, starting at FIG. 4, an overview of a conventional ET power management apparatus that can experience ET voltage distortion is first provided with reference to FIGS. 1 to 3.

FIG. 1 is a schematic diagram of an exemplary conventional power management apparatus 10 configured to generate an ET voltage $V_{CC}$. The conventional power management apparatus 10 includes a transceiver circuit 12, an ETIC 14, a power amplifier circuit 16, and a signal line(s) 18 that couples the ETIC 14 to the power amplifier circuit 16.

The transceiver circuit 12 is configured to generate and provide an RF signal 20, which is associated with a time-variant power envelope $P_{ENV}$, to the power amplifier circuit 16. The transceiver circuit 12 is also configured to generate (a.k.a. track) a target voltage $V_{TGT}$ in accordance with the time-variant power envelope $P_{ENV}$. The ETIC 14 is configured to generate the ET voltage $V_{CC}$ based on the target voltage $V_{TGT}$ and the power amplifier circuit 16 is configured to amplify the RF signal 20 based on the ET voltage $V_{CC}$.

Those skilled in the art will appreciate that the power amplifier circuit 16 may operate with improved efficiency and linearity when the ET voltage $V_{CC}$ accurately tracks the power envelope $P_{ENV}$ of the RF signal 20. This is achieved when the ET voltage $V_{CC}$ is temporally aligned with the target voltage $V_{TGT}$ at the power amplifier circuit 16. However, temporal alignment between the ET voltage $V_{CC}$ and the target voltage $V_{TGT}$ may be complicated by various impedances, capacitances, and/or inductances presenting in the conventional power management apparatus 10.

To illustrate the various impedances, capacitance, and/or inductances, FIG. 2 is a schematic diagram of an exemplary equivalent circuit 22 for illustrating the various impedances, capacitances, and/or inductances in the conventional power management apparatus 10 of FIG. 1 that can distort the ET voltage $V_{CC}$. Common elements between FIGS. 1 and 2 are shown therein with common element numbers and will not be re-described herein.

In the equivalent circuit 22, the ETIC 14 in FIG. 1 has an inherent impedance that can be modeled by an equivalent inductance $L_{ETIC}$ and the signal line(s) 18 in FIG. 1 has an inherent trace inductance that can be modeled by an equivalent trance trace inductance $L_{TRACE}$. Accordingly, the equivalent circuit 22 would have a total equivalent inductance L that equals a sum of the equivalent inductance $L_{ETIC}$ and the equivalent trace inductance $L_{TRACE}$ ($L = L_{ETIC} + L_{TRACE}$).

The power amplifier circuit 16 can be modeled as a current source with a modulated current $I_{CC}(s)$ and have a total equivalent capacitance $C_{PA}$. Accordingly, an equivalent source impedance $Z_{SOURCE}(s)$ presented to the current source can be determined as in equation (Eq. 1) below.

$$Z_{SOURCE}(s) = \frac{s*L}{1 + L*C_{PA}*s^2} \qquad \text{(Eq. 1)}$$

In the equation (Eq. 1), s represents the s-transform notation, which can be expressed as $s = j2\pi f$. The modulated current $I_{CC}(s)$ is somewhat proportional to the target voltage $V_{TGT}$ and can be expressed as in equation (Eq. 2) below.

$$I_{CC}(s) = \frac{V_{TGT}(s)}{Z_{ICC}(s)*e^{(-s*\Delta D)}} \qquad \text{(Eq. 2)}$$

In the equation (Eq. 2) above, $Z_{ICC}(s)$ represents an impedance at a collector (not shown) of the power amplifier circuit 16 and $\Delta D$ represents a group delay between the $V_{TGT}$ and the time-variant power envelope $P_{EVN}$ at an output stage (not shown) of the power amplifier circuit 16.

Notably, the modulated current $I_{CC}$ can create a voltage disturbance across the collector of the power amplifier circuit 16. The voltage disturbance is approximately equal to $Z_{SOURCE}(s)*I_{CC}(s)$. As illustrated and discussed in FIG. 3, the voltage disturbance may primarily be caused by the total equivalent inductance L and the total equivalent capacitance $C_{PA}$. FIG. 3 is a graphic diagram providing an exemplary illustration of factors contributing to the voltage disturbance in the equivalent circuit 22 of FIG. 2 that can distort the ET voltage $V_{CC}$ in FIG. 1.

FIG. 3 illustrates a transfer function curve 24 that shows a transfer function of the equivalent trace inductance $L_{TRACE}$ that can cause the voltage disturbance in the ET voltage $V_{CC}$. As shown in FIG. 3, the equivalent trace inductance $L_{TRACE}$ can cause the ET voltage $V_{CC}$ to peak in a disturbance energy spectrum 26 centered at an impedance resonance frequency f, which can be expressed as in equation (Eq. 3) below.

$$f = 1/(2\pi\sqrt{L*C_{PA}}) \qquad \text{(Eq. 3)}$$

In the equation (Eq. 3) above, L represents the total equivalent inductance and $C_{PA}$ represents the total equivalent capacitance in the equivalent circuit 22 of FIG. 2. When the RF signal 20 is modulated with a low modulation bandwidth (e.g., <100 MHz), there may be sufficient separation between the disturbance energy spectrum 26 and an energy spectrum 28 associated with the low modulation bandwidth. As such, it may be possible to offset the voltage disturbance by employing an equalizer circuit (not shown) with a proper transfer function in the ETIC 14.

In contrast, when the RF signal 20 is modulated with a high modulation bandwidth (e.g., ≥200 MHz), the disturbance energy spectrum 26 may be very close or even overlap with an energy spectrum 30 associated with the high modulation bandwidth. As such, it may not be possible to rely solely on the equalizer circuit to offset the voltage disturbance to avoid potential distortion in the ET voltage $V_{CC}$.

However, as shown in the equation (Eq. 3), it is possible to shift the impedance resonance frequency f, and thereby the disturbance energy spectrum 26, away (e.g., rightward) from the energy spectrum 30 associated with the high modulation bandwidth by reducing the overall equivalent capacitance $C_{PA}$. Thus, by pushing away the disturbance energy spectrum 26 in addition to employing the equalizer circuit to offset the voltage disturbance, it is possible to minimize potential distortion in the ET voltage $V_{CC}$. In this regard, FIG. 4 is a schematic diagram of an exemplary ET power management circuit 32 configured according to embodiments of the present disclosure to operate across a wide modulation bandwidth.

The ET power management circuit 32 includes an ETIC 34. The ETIC 34 includes a first ET voltage circuit 36A and a second ET voltage circuit 36B. The first ET voltage circuit 36A is configured to generate a first ET voltage $V_{CCA}$ based on a first target voltage $V_{TGTA}$. The second ET voltage circuit 36B is configured to generate a second ET voltage $V_{CCB}$ based on a second target voltage $V_{TGTB}$. Notably, the first ET voltage $V_{CCA}$ can be identical to or different from the second ET voltage $V_{CCB}$.

The ETIC 34 includes at least two primary voltage outputs 38A, 38B, and at least two auxiliary voltage outputs 40A, 40B. In an embodiment, the primary voltage outputs 38A, 38B are each coupled to a respective one of at least two low-bandwidth power amplifier circuits 42A, 42B (denoted as "LBW PA") via a respective one of at least two primary signal lines 44A, 44B. In a non-limiting example, the low-bandwidth power amplifier circuits 42A, 42B can each amplify a respective one of at least two low-bandwidth RF signals 46A, 46B, which are modulated with a low modulation bandwidth (e.g., <100 MHz), based on a respective one of the first ET voltage $V_{CCA}$ and the second ET voltage $V_{CCB}$.

Notably, the primary signal line 44A can have an equivalent trace inductance $L_{TRACE-44A}$ and the primary signal line 44B can have an equivalent trace inductance $L_{TRACE-44B}$. The equivalent trace inductance $L_{TRACE-44A}$ and the equivalent trace inductance $L_{TRACE-44B}$ are equivalent to the equivalent trace inductance $L_{TRACE}$ in FIG. 2. The low-bandwidth power amplifier circuit 42A can have an equivalent capacitance $C_{PA-42A}$ and the low-bandwidth power amplifier circuit 42B can have an equivalent capacitance $C_{PA-42B}$ (each also referred to as "first equivalent capacitance"). The equivalent capacitance $C_{PA-42A}$ and the equivalent capacitance $C_{PA-42B}$ can be equivalent to the total equivalent capacitance $C_{PA}$ in FIG. 2. In this regard, the low-bandwidth power amplifier circuit 42A can cause a voltage disturbance around an impedance resonance frequency $1/(2\pi\sqrt{L_{TRACE-44A}{}^*C_{PA-42A}})$ to any ET voltage (e.g., the first ET voltage $V_{CCA}$) outputted via the primary voltage output 38A. Likewise, the low-bandwidth power amplifier circuit 42B can cause a voltage disturbance around an impedance resonance frequency $1/(2\pi\sqrt{L_{TRACE-44B}{}^*C_{PA-42B}})$ to any ET voltage (e.g., the ET voltage $V_{CCB}$) outputted via the primary voltage output 38B.

The auxiliary voltage outputs 40A, 40B are each coupled to a high-bandwidth power amplifier circuit 48 (denoted as "HBW PA") via a respective one of at least two auxiliary signal lines 50A, 50B. In a non-limiting example, the high-band power amplifier circuit 48 can amplify a high-bandwidth RF signal 52, which is modulated with a high modulation bandwidth (e.g., 200 MHz), based on both the first ET voltage $V_{CCA}$ and the second ET voltage $V_{CCB}$.

Notably, the auxiliary signal lines 50A, 50B can each have a respective one of equivalent trace inductances $L_{TRACE-50A}$, $L_{TRACE-50B}$ that are equivalent to the equivalent trace inductance $L_{TRACE}$ in FIG. 2. The high-bandwidth power amplifier circuit 48 can also present equivalent capacitances $C_{PA-48}$ (also referred to as "second equivalent capacitance"), which is equivalent to the total equivalent capacitance $C_{PA}$ in FIG. 2, to each of the auxiliary voltage outputs 40A, 40B. In this regard, the high-bandwidth power amplifier circuit 48 can also cause a voltage disturbance to any ET voltages outputted via the auxiliary voltage outputs 40A, 40B. The voltage disturbances can be around impedance resonance frequencies $1/(2\pi\sqrt{L_{TRACE-50A}{}^*C_{PA-48}})$ and $1/(2\pi\sqrt{L_{TRACE-50B}{}^*C_{PA-48}})$.

In embodiments disclosed herein, the equivalent capacitances $C_{PA-48}$ of the high-bandwidth power amplifier 48 is configured to be lower than the equivalent capacitance $C_{PA-42A}$ of the low-bandwidth power amplifier circuit 42A and the equivalent capacitance $C_{PA-42B}$ of the low-bandwidth power amplifier circuit 42B. As such, if the equivalent trace inductances $L_{TRACE-50A}$, $L_{TRACE-50B}$, $L_{TRACE-44A}$, and $L_{TRACE-44B}$ are substantially equal, the impedance resonance frequencies $1/(2\pi\sqrt{L_{TRACE-50A}{}^*C_{PA-48}})$ and $1/(2\pi\sqrt{L_{TRACE-50B}{}^*C_{PA-48}})$ will each be higher than any of the impedance resonance frequencies $1/(2\pi\sqrt{L_{TRACE-44A}{}^*C_{PA-42A}})$ and $1/(2\pi\sqrt{L_{TRACE-44B}{}^*C_{PA-42B}})$. Thus, by utilizing the high-bandwidth power amplifier circuit 48 to amplify the high-bandwidth RF signal 52, as opposed to using any of the low-bandwidth power amplifier circuits 42A, 42B, it is possible to shift the disturbance energy spectrum 26 in FIG. 3 away from the energy spectrum 30 to thereby mitigate potential distortion in any of the first ET voltage $V_{CCA}$ and the second ET voltage $V_{CCB}$. Hence, it would be desirable to utilize exclusively the high-bandwidth power amplifier circuit 48 when the ETIC 34 needs to operate with a high modulation bandwidth (e.g., ≥200 MHz). In contrast, it may be possible to utilize one or more of the low-bandwidth power amplifier circuits 42A, 42B and/or the high-bandwidth power amplifier circuit 48 when the ETIC 34 needs to operate with a low modulation bandwidth (e.g., <200 MHz).

In this regard, the ETIC 34 further includes a control circuit 54. The control circuit 54, which can be a field-programmable gate array (FPGA) as an example, is configured to determine whether the ETIC 34 needs to operate with the high modulation bandwidth or the low modulation bandwidth. In response to determining that the ETIC 34 needs to operate within the high modulation bandwidth, the control circuit 54 is configured to couple each of the first ET voltage circuit 36A and the second ET voltage circuit 36B to a respective one of the auxiliary voltage outputs 40A, 40B. Accordingly, the auxiliary voltage outputs 40A, 40B will provide the first ET voltage $V_{CCA}$ and the second ET voltage $V_{CCB}$, respectively, to the high-bandwidth power amplifier circuit 48. The control circuit 54 may also decouple the first ET voltage circuit 36A and the second ET voltage circuit 36B from any of the primary voltage outputs 38A, 38B, either concurrent to or after coupling the first ET voltage circuit 36A and the second ET voltage circuit 36B to the auxiliary voltage outputs 40A, 40B.

The ETIC 34 may include a switch circuit 56 that includes switches $S_A$, $S_B$, $S_{AA}$, and $S_{AB}$. In a non-limiting example, the switch $S_A$ is coupled between the first ET voltage circuit 36A and the primary voltage output 38A, the switch $S_B$ is coupled between the second ET voltage circuit 36B and the primary voltage output 38B, the switch $S_{AA}$ is coupled between the first ET voltage circuit 36A and the auxiliary voltage output 40A, and the switch $S_{AB}$ is coupled between the second ET voltage circuit 36B and the auxiliary voltage output 40B. In this regard, the control circuit 54 can close switches $S_{AA}$, $S_{AB}$ and open switches $S_A$, $S_B$ in response to determining that the ETIC 34 needs to operate with the high modulation bandwidth.

In contrast, in response to determining that the ETIC 34 needs to operate within the low modulation bandwidth, the control circuit 54 is configured to couple at least one of the first ET voltage circuit 36A and the second ET voltage circuit 36B to at least one of the primary voltage outputs 38A, 38B. The control circuit 54 may also decouple the first ET voltage circuit 36A and the second ET voltage circuit 36B from any of the auxiliary voltage outputs 40A, 40B, either concurrent to or after coupling the first ET voltage circuit 36A and the second ET voltage circuit 36B to the primary voltage outputs 38A, 38B. To do so, the control circuit 54 can open switches $S_{AA}$, $S_{AB}$ and close at least one of switches $S_A$, $S_B$ in response to determining that the ETIC 34 needs to operate with the low modulation bandwidth.

The control circuit 54 may be configured to determine whether the ETIC 34 needs to operate with the high modulation bandwidth or the low modulation bandwidth based on any of following embodiments. In one embodiment, the control circuit 54 may determine whether the ETIC 34 needs to operate with the high modulation bandwidth or the low modulation bandwidth based on any of the first target voltage $V_{TGTA}$ and the second target voltage $V_{TGTB}$. In another embodiment, the control circuit 54 may also determine whether the ETIC 34 needs to operate with the high modulation bandwidth or the low modulation bandwidth based on a higher one of the first target voltage $V_{TGTA}$ and the second target voltage $V_{TGTB}$. In another embodiment, the control circuit 54 may determine whether the ETIC 34 needs to operate with the high modulation bandwidth or the low modulation bandwidth based on presence or absence of the high-bandwidth RF signal 52 and/or presence or absence of the low-bandwidth RF signals 46A, 46B. In another embodiment, the control circuit 54 may determine whether the ETIC 34 needs to operate with the high modulation bandwidth or the low modulation bandwidth based on activation or deactivation of the high-bandwidth power amplifier circuit 48 and/or activation or deactivation of the low-bandwidth power amplifier circuits 42A, 42B. In another embodiment, the control circuit 54 may determine whether the ETIC 34 needs to operate with the high modulation bandwidth or the low modulation bandwidth by receiving an indication 58 from a transceiver circuit (not shown) that generates the high-bandwidth RF signal 52 and/or the low-bandwidth RF signals 46A, 46B. In yet another embodiment, the control circuit 54 may determine whether the ETIC 34 needs to operate with the high modulation bandwidth or the low modulation bandwidth based on any combination of the above-described embodiments.

The ETIC 34 may also include a first voltage equalizer circuit 60A and a second voltage equalizer circuit 60B (each denoted as "VEQ"). The first voltage equalizer circuit 60A is coupled to the first ET voltage circuit 36A and configured to equalize the first target voltage $V_{TGTA}$ based on a first transfer function $H_1(s)$. The second voltage equalizer circuit 60B is coupled to the second ET voltage circuit 36B and configured to equalize the second target voltage $V_{TGTB}$ based on a second transfer function $H_2(s)$.

In a non-limiting example, each of the first transfer function $H_1(s)$ and the second transfer function $H_2(s)$ can include a second-order complex-zero term and a real-zero term, which can reduce the voltage disturbance caused by any of the equivalent trace inductances $L_{TRACE-50A}$, $L_{TRACE-50B}$, $L_{TRACE-44A}$, and $L_{TRACE-44B}$. For further detail as to how the first transfer function $H_1(s)$ and the second transfer function $H_2(s)$ can be implemented in the first voltage equalizer circuit 60A and the second voltage equalizer circuit 60B with the second-order complex-zero term and the real-zero term, please refer to U.S. patent application Ser. No. 17/412,823, entitled "EQUALIZER CIRCUIT AND RELATED POWER MANAGEMENT CIRCUIT."

The high-bandwidth power amplifier circuit 48 can be configured according to an embodiment as shown in FIG. 5. In this regard, FIG. 5 is a schematic diagram providing an exemplary illustration of the high-bandwidth power amplifier circuit 48 in the ET power management circuit 32 of FIG. 4. Common elements between FIGS. 4 and 5 are shown therein with common element numbers and will not be re-described herein.

The high-bandwidth power amplifier circuit 48 includes a plus input stage 62 (denoted as "$PA_{P-IN}$") and a plus output stage 64 (denoted as "$PA_{P-OUT}$") each coupled to a first one of the auxiliary voltage outputs 40A, 40B (e.g., 40A). The high-bandwidth power amplifier circuit 48 also includes a minus input stage 66 (denoted as "$PA_{M-IN}$") and a minus output stage 68 (denoted as "$PA_{M-OUT}$") each coupled to a second one of the auxiliary voltage outputs 40A, 40B (e.g., 40B). The plus output stage 64 is coupled to a plus load capacitor $C_{LOAD-P}$ and the minus output stage 68 is coupled to a minus load capacitor $C_{LOAD-M}$. The plus load capacitor $C_{LOAD-P}$ and the minus load capacitor $C_{LOAD-M}$ are provided to provide required RF capacitance to help provide RF isolation between input and output stages as well as to improve stability under large output voltage standing wave ratio (VSWR) handling. In a non-limiting example, the plus load capacitor $C_{LOAD-P}$ and the minus load capacitor $C_{LOAD-M}$ are configured to have an equal capacitance. Notably, the plus load capacitor $C_{LOAD-P}$ and the minus load capacitor $C_{LOAD-M}$ are each considered the predominant capacitance in the equivalent capacitance $C_{PA-48}$ presented at the auxiliary voltage outputs 40A, 40B.

The low-bandwidth power amplifier circuits 42A, 42B can each be configured according to an embodiment as shown in FIG. 6. In this regard, FIG. 6 is a schematic diagram providing an exemplary illustration of the low-bandwidth power amplifier circuits 42A, 42B in the ET power management circuit 32 of FIG. 4. Common elements between FIGS. 4 and 6 are shown therein with common element numbers and will not be re-described herein.

As shown in FIG. 6, the low-bandwidth power amplifier circuits 42A, 42B can each include an input stage 70 (denoted as "$PA_{IN}$") and an output stage 72 (denoted as "$PA_{OUT}$"). The input stage 70 and the output state 72 are each coupled to a respective one of the primary voltage outputs 38A, 38B to receive a respective one of the first ET voltage $V_{CCA}$ and the second ET voltage $V_{CCB}$. The output stage 72 is coupled to a load capacitor $C_{LOAD}$. Like the plus load capacitor $C_{LOAD-P}$ and the minus load capacitor $C_{LOAD-M}$, the load capacitor $C_{LOAD}$ is provided to provide required RF capacitance to help provide RF isolation between input and output stages as well as to improve stability under large output VSWR handling. Also, the load capacitor $C_{LOAD}$ is considered the predominant capacitance in the equivalent capacitances $C_{PA-42A}$, $C_{PA-42B}$.

In a non-limiting example, the plus load capacitor $C_{LOAD-P}$ and the minus load capacitor $C_{LOAD-M}$ are each configured to have a lower capacitance than the load capacitor $C_{LOAD}$ (e.g., $C_{LOAD-P}$=$C_{LOAD-M}$=½ $C_{LOAD}$). As a result, the equivalent capacitance $C_{PA-48}$ (a.k.a. the "second equivalent capacitance") can become lower than both the equivalent capacitance $C_{PA-42A}$ and the equivalent capacitance $C_{PA-42B}$ (a.k.a. the "first equivalent capacitance").

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (ETIC) comprising:

at least two primary voltage outputs each coupled to a respective one of at least two low-bandwidth power amplifier circuits each having a first equivalent capacitance;

at least two auxiliary voltage outputs coupled to a high-bandwidth power amplifier circuit having a second equivalent capacitance lower than the first equivalent capacitance to thereby cause the high-bandwidth power amplifier circuit to have a higher impedance resonance frequency than each of the at least two low-bandwidth power amplifier circuits;

a first ET voltage circuit configured to generate a first ET voltage based on a first target voltage;

a second ET voltage circuit configured to generate a second ET voltage based on a second target voltage; and a control circuit configured to:

determine whether the ETIC needs to operate with a high modulation bandwidth or a low modulation bandwidth; and couple each of the first ET voltage circuit and the second ET voltage circuit to a respective one of the at least two primary voltage outputs in response to determining that the ETIC needs to operate with the low modulation bandwidth.

2. The ETIC of claim 1, wherein the control circuit is further configured to decouple the first ET voltage circuit and the second ET voltage circuit from the at least two primary voltage outputs in response to determining that the ETIC needs to operate with the high modulation bandwidth.

3. The ETIC of claim 1, wherein the control circuit is further configured to decouple the first ET voltage circuit and the second ET voltage circuit from the at least two auxiliary voltage outputs in response to determining that the ETIC needs to operate with the low modulation bandwidth.

4. The ETIC of claim 1, wherein the control circuit is further configured to determine whether the ETIC needs to operate with the high modulation bandwidth or the low modulation bandwidth based on any one of the first target voltage and the second target voltage.

5. The ETIC of claim 4, wherein the control circuit is further configured to determine whether the ETIC needs to operate with the high modulation bandwidth or the low modulation bandwidth based on a higher one of the first target voltage and the second target voltage.

6. The ETIC of claim 1, further comprising:

a first voltage equalizer circuit coupled to the first ET voltage circuit and configured to equalize the first target voltage based on a first transfer function; and a second voltage equalizer circuit coupled to the second ET voltage circuit and configured to equalize the second target voltage based on a second transfer function.

7. An envelope tracking (ET) power management circuit comprising:

at least two low-bandwidth power amplifier circuits each having a first equivalent capacitance;

a high-bandwidth power amplifier circuit having a second equivalent capacitance lower than the first equivalent capacitance to thereby cause the high-bandwidth power amplifier circuit to have a higher impedance resonance frequency than each of the at least two low-bandwidth power amplifier circuits; and an ET integrated circuit (ETIC) comprising:

at least two primary voltage outputs each coupled to a respective one of the at least two low-bandwidth power amplifier circuits;

at least two auxiliary voltage outputs coupled to the high-bandwidth power amplifier circuit;

a first ET voltage circuit configured to generate a first ET voltage based on a first target voltage;

a second ET voltage circuit configured to generate a second ET voltage based on a second target voltage; and a control circuit configured to:

determine whether the ETIC needs to operate with a high modulation bandwidth or a low modulation bandwidth;

couple each of the first ET voltage circuit and the second ET voltage circuit to a respective one of the at least two auxiliary voltage outputs in response to determining that the ETIC needs to operate with the high modulation bandwidth; and couple each of the first ET voltage circuit and the second ET voltage circuit to a respective one of the at least two primary voltage outputs in response to determining that the ETIC needs to operate with the low modulation bandwidth.

8. The ET power management circuit of claim 7, wherein the control circuit is further configured to decouple the first ET voltage circuit and the second ET voltage circuit from the at least two primary voltage outputs in response to determining that the ETIC needs to operate with the high modulation bandwidth.

9. The ET power management circuit of claim 7, wherein the control circuit is further configured to decouple the first ET voltage circuit and the second ET voltage circuit from the at least two auxiliary voltage outputs in response to determining that the ETIC needs to operate with the low modulation bandwidth.

10. The ET power management circuit of claim 7, wherein the control circuit is further configured to determine whether the ETIC needs to operate with the high modulation bandwidth or the low modulation bandwidth based on any one of the first target voltage and the second target voltage.

11. The ET power management circuit of claim 10, wherein the control circuit is further configured to determine whether the ETIC needs to operate with the high modulation bandwidth or the low modulation bandwidth based on a higher one of the first target voltage and the second target voltage.

12. The ET power management circuit of claim 7, further comprising:

a first voltage equalizer circuit coupled to the first ET voltage circuit and configured to equalize the first target voltage based on a first transfer function; and a second voltage equalizer circuit coupled to the second ET voltage circuit and configured to equalize the second target voltage based on a second transfer function.

13. The ET power management circuit of claim 12, wherein the first transfer function and the second transfer function are each determined to offset a voltage disturbance caused by any one of the high-bandwidth power amplifier circuit and the at least two low-bandwidth power amplifier circuits.

14. The ET power management circuit of claim 7, wherein the high-bandwidth power amplifier circuit comprises:

a plus input stage and a plus output stage each coupled to a first one of the at least two auxiliary voltage outputs; and a minus input stage and a minus output stage each coupled to a second one of the at least two auxiliary voltage outputs.

15. The ET power management circuit of claim 14, wherein the plus output stage and the minus output stage are coupled to a plus load capacitor and a minus load capacitor, respectively.

16. The ET power management circuit of claim 15, wherein the at least two low-bandwidth power amplifier circuits each comprises an input stage and an output stage coupled to a respective one of the at least two primary voltage outputs.

17. The ET power management circuit of claim 16, wherein the output stage is coupled to a load capacitor.

18. The ET power management circuit of claim 17, wherein the plus load capacitor and the minus load capacitor are configured to each have a lower capacitance than the load capacitor to thereby cause the second equivalent capacitance to be lower than the first equivalent capacitance.

\* \* \* \* \*